(12) United States Patent
Liu et al.

(10) Patent No.: US 6,444,519 B1
(45) Date of Patent: Sep. 3, 2002

(54) METHOD FOR FORMING A CAPACITOR IN A MIXED MODE CIRCUIT DEVICE BY ION IMPLANTATION

(75) Inventors: Chien-Hung Liu, Taipei; Shou-Wei Huang, Chilung; Shyi-Shuh Pan, Kaohsiung, all of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/120,286

(22) Filed: Apr. 9, 2002

(51) Int. Cl.$^7$ ......................................... H01L 21/8242
(52) U.S. Cl. .................................... 438/250; 438/393
(58) Field of Search ............................ 438/3, 240, 250, 438/251, 393, 394, 520, 522, 526, 528

(56) References Cited

U.S. PATENT DOCUMENTS 5,217,908 A * 6/1993 Nakanishi .................. 438/250
5,250,456 A * 10/1993 Bryant ...................... 438/253
6,124,161 A * 9/2000 Chern et al. ................ 438/195
2001/0019874 A1 * 9/2001 Uemoto ...................... 438/396
2002/0061604 A1 * 5/2002 Sitaram et al. ................. 438/3

* cited by examiner

Primary Examiner—Tuan H. Nguyen
(74) Attorney, Agent, or Firm—J.C. Patents

(57) ABSTRACT

The invention provides a method for forming a capacitor in a mixed mode circuit device through ion implantation. The method includes forming a polysilicon layer over a substrate, which substrate has isolation region formed thereon. An ion implantation process is performed to implant oxygen ions into the polysilicon layer. An annealing process is performed to trigger an reaction between the oxygen ions and the silicon ions. As a result, a silicon oxide layer is formed within the polysilicon layer. The silicon layer and the polysilicon layer are patterned, where the top portion of the polysilicon layer above the silicon oxide layer serves as an upper electrode of a capacitor. The polysilicon layer below the silicon oxide layer serves as the lower electrode.

17 Claims, 2 Drawing Sheets

METHOD FOR FORMING A CAPACITOR IN A MIXED MODE CIRCUIT DEVICE BY ION IMPLANTATION

CROSS-REFERENCE TO RELATED APPLICATION

This application claims the priority benefit of Taiwan application serial no. 91106567, filed Apr. 2, 2002.

BACKGROUND OF THE INVENTION

1. Field of the Invention

The present invention relates to semiconductor fabrication. Particularly, the present invention relates to a method for forming a capacitor in a mixed mode circuit device using ion implantation.

2. Description of the Related Art

A mixed mode circuit device usually is that there are digital circuit device and analog circuit device formed on at the same logic region. The digital circuit device includes, for example, flip-flop circuit or adder and the analog circuit device includes, for example, amplifier, analog to digital converter and so on. In the mixed mode circuit device, it also usually includes capacitor, used for storing charges. Moreover, the charges stored in each the capacitor also need to remain the same.

FIGS. 1A–1C are cross-sectional views, schematically illustrating a conventional fabrication processes for forming a capacitor in a mixed mode circuit device.

In FIG. 1A, the conventional method to form a capacitor in a mixed mode circuit device usually first forms a field oxide layer 102 on a substrate 100. Then, a polysilicon layer 104 is formed on the field oxide layer 102 to serve as a lower electrode of the capacitor.

In FIG. 1B, a thermal oxidation process is performed to form an oxide layer 106 on the polysilicon layer 104.

In FIG. 1C, another polysilicon layer 108 is formed on the oxide layer 106. The polysilicon layer 108 and the oxide layer 106 are patterned to accomplish a capacitor.

The conventional method for forming capacitor usually takes a stack manner to form the capacitor of conductive-insulating-conductive structure. In this method, the necessary steps are high and complicate. Moreover, it is easy to cause defects on the interface for the capacitor formed by the stack manner, and further result in problems for the circuit.

SUMMARY OF THE INVENTION

The invention provides a method for forming a capacitor in a mixed mode circuit device through ion implantation, so as to reduce the complexity of fabrication processes and avoid defects on the interfaces.

The invention provides a method for forming a capacitor in a mixed mode circuit device through ion implantation. The method includes forming a polysilicon layer over a substrate, which substrate has isolation region formed thereon. An ion implantation process is performed to implant oxygen ions into the polysilicon layer. An annealing process is performed to trigger an reaction between the oxygen ions and the silicon ions. As a result, a silicon oxide layer is formed within the polysilicon layer. The silicon layer and the polysilicon layer are patterned, where the top portion of the polysilicon layer above the silicon oxide layer serves as an upper electrode of a capacitor. The polysilicon layer below the silicon oxide layer serves as the lower electrode. The capacitor in a mixed mode circuit device is accomplished.

In the invention, since the ion implantation is used to implant oxygen ions into the polysilicon layer. After the annealing process, the oxide layer is formed with the polysilicon layer. The fabrication processes are simplified. Moreover, the oxide layer within the polysilicon layer is formed gradually, so that the defect on the interface is effectively avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
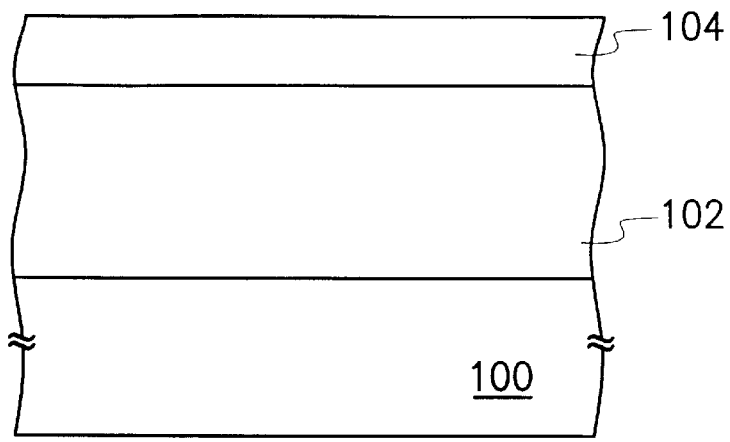
FIGS. 1A through 1C are cross-sectional drawings, illustrating the conventional process for fabricating a capacitor in a mixed mode circuit device.
Figure 1B:
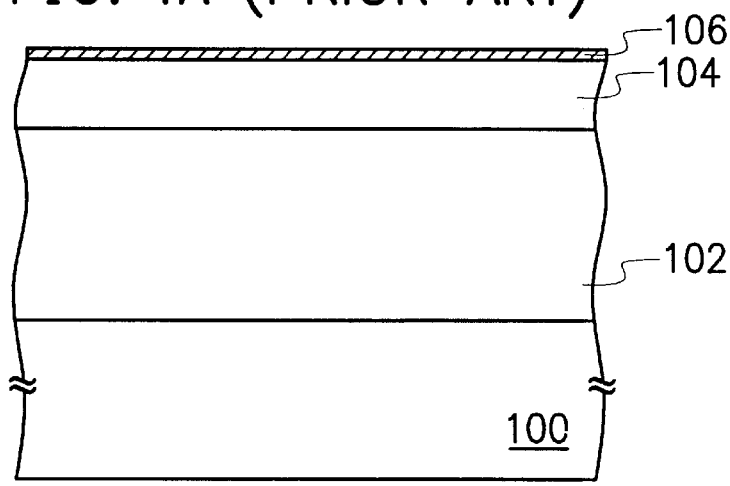
Figure 1C:
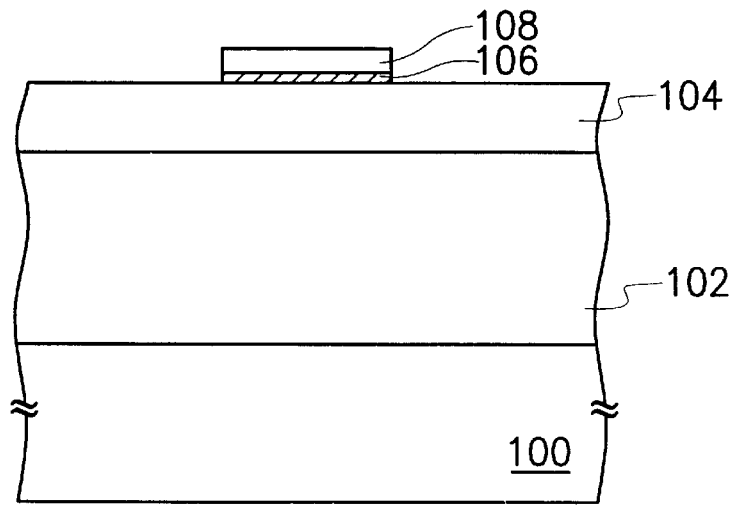
Figure 2A:
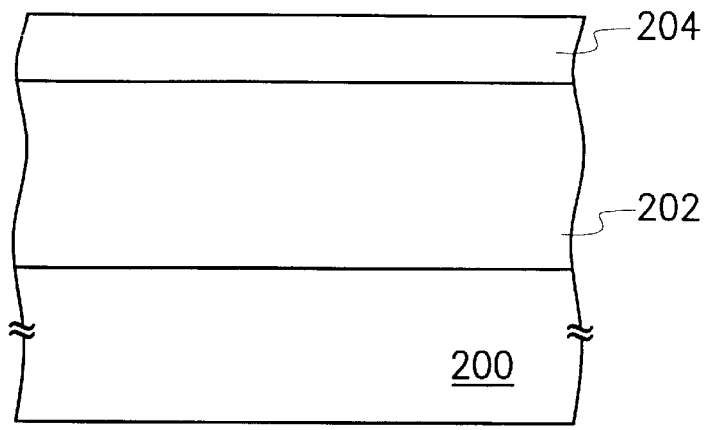
FIGS. 2A through 2C are cross-sectional drawings, schematically illustrating the process for fabricating a capacitor in a mixed mode circuit device, according to one preferred embodiment of the invention.
Figure 2B:
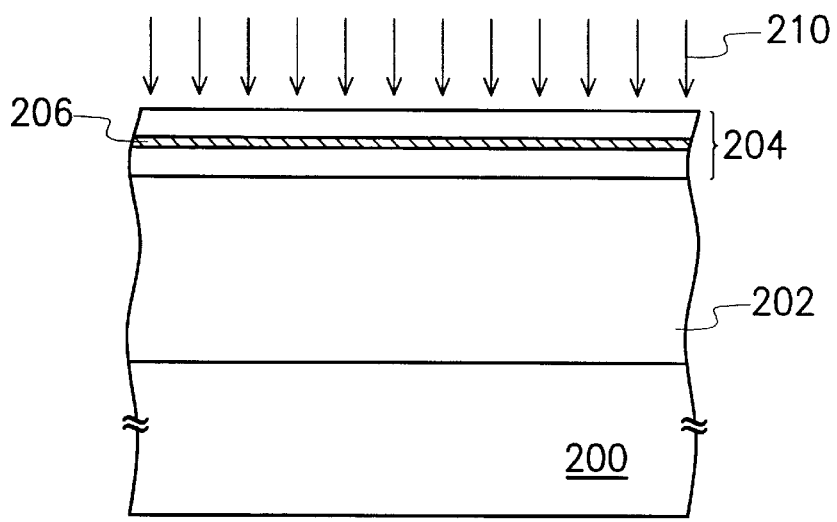
Figure 2C:
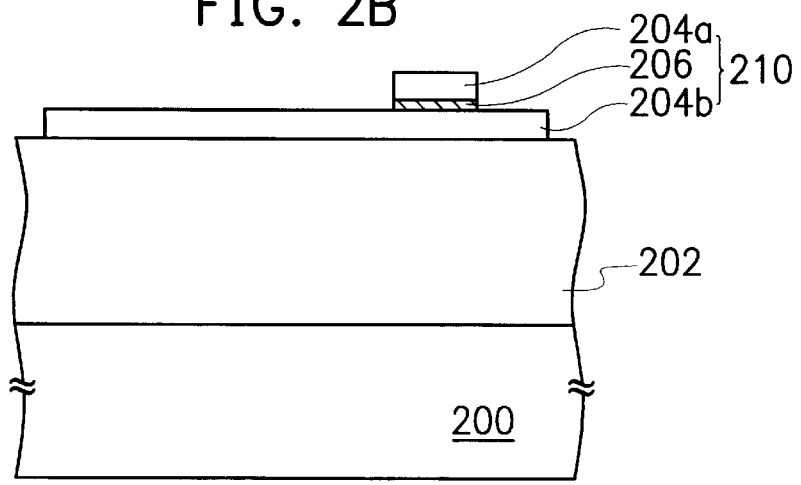

FIGS. 2A through 2C are cross-sectional drawings, schematically illustrating the process for fabricating a capacitor in a mixed mode circuit device, according to one preferred embodiment of the invention.

In FIG. 2A, a conductive layer 204 is formed on a substrate 200. The substrate 200 has isolation layer 202 already formed thereon. The isolation layer 202 includes, for example, field oxide layer or shallow trench isolation layer. In the invention, the field oxide layer is used as an example to serve as the isolation structure 202, and thickness is, for example, about 400 nm, and is formed by, for example, thermal oxidation. The conductive layer 204 includes, for example, polysilicon with a thickness of, for example, about 250 nm. The conductive layer 204 is formed by, for example, chemical vapor deposition.

In FIG. 2B, an ion implantation process 210 is performed onto the conductive layer 204. The type of implanted ions in the ion implantation process 210 depends on the material of the conductive layer 204. For example, if the conductive layer 204 is polysilicon, the implanted ions are oxygen ions. The ion energy is, for example, 30 KeV –80 KeV. The dosage is, for example, about $10^{14}$–$10^{17}$ ions/cm$^2$. The implanting depth for the ions is about 80 nm–200 nm. The ion energy preferably is 50 KeV, and the implanting depth preferably is 100 nm. Then, an annealing process is performed, so as to trigger an reaction between the implanted ions and the ions of the conductive layer 204. As a result, a dielectric layer 206 is formed within the conductive layer 204. If the conductive layer 204 is a polysilicon layer and the implanted ions are oxygen ions, then the dielectric layer 206 is an silicon oxide layer. The dielectric layer 206 has a preferred thickness of about 30 nm. In this method, the silicon oxide layer is formed gradually at he interface with the conductive layer. This can reduce the defects at the interface.

In FIG. 2C, the dielectric layer 206 and the conductive layer 204 are patterned to form the capacitor in the mixed mode circuit device with the upper electrode 204a and the lower electrode 204b, in which the capacitor 210 is thereby formed. The patterning process for the dielectric layer 206 and the conductive layer 204a on the dielectric layer 206 includes, for example, forming a patterned photoresist layer (not shown) to serve as a mask. The exposed portion of the conductive layer 204a is etched. Using the conductive layer 204b as an etching stop, the dielectric layer 206 is etched also.

In summary, the invention has several advantages as follows:

1. The invention uses the ion implantation process to implant oxygen ions into the polysilicon layer, which polysilicon layer is used as electrodes. An annealing process is performed to form the silicon oxide layer within the polysilicon layer, so that a capacitor is formed. The capacitor of the invention replace the convention stack manner for forming the capacitor. Therefore, the fabrication process is simplified, and the fabrication cost is reduced.

2. The invention uses ion implantation and annealing process to form the capacitor. Since the concentration distribution of the implanted ions is a Gaussian distribution, the dielectric layer formed by annealing at the interface is also a Gaussian distribution. Thereby, the defects at the interfaces are greatly reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a capacitor in a mixed mode circuit device by ion implantation, the method comprising:
   providing a substrate;
   forming a polysilicon layer on the substrate;
   performing an ion implantation process to implant oxygen ions into the polysilicon layer;
   performing an annealing process to trigger a reaction between the oxygen ions and silicon ions of the polysilicon layer to form a silicon oxide layer within the polysilicon layer; and
   patterning the silicon oxide layer and the polysilicon layer, wherein an upper portion of the polysilicon layer above the silicon oxide layer serves as an upper electrode, and a lower portion of the polysilicon layer below the silicon oxide layer serves as a lower electrode.

2. The method of claim 1, wherein the step of performing an ion implantation process comprises an ion energy of 30 KeV–80 KeV.

3. The method of claim 1, wherein the step of performing an ion implantation process comprises a dosage of $10^{14}$–$10^{17}$ ions/cm$^2$.

4. The method of claim 1, wherein the step of performing an ion implantation process comprises an implanting depth of 80 nm–200 nm.

5. The method of claim 1, wherein the lower electrode and the upper electrode are formed on an isolation layer on the substrate.

6. A method for forming a capacitor in a mixed mode circuit device by ion implantation, wherein the method is suitable for a substrate, the substrate has an isolation layer formed thereon, the method comprising:
   forming a conductive layer on the isolation layer;
   performing an ion implantation process to implant ions into the conductive layer, wherein the ions can react with the conductive layer;
   performing an annealing process to trigger a reaction between the implanted ions and ions of the conductive layer to form a dielectric layer within the conductive layer; and
   patterning the dielectric layer and the conductive layer, wherein an upper portion of the conductive layer above the dielectric layer serves as an upper electrode, and a lower portion of the conductive layer below the dielectric layer serves as a lower electrode.

7. The method of claim 6, wherein the conductive layer comprises polysilicon.

8. The method of claim 7, wherein the step of performing the ion implantation process comprises implanting oxygen ions.

9. The method of claim 8, wherein the step of performing an ion implantation process comprises an ion energy of 30 KeV–80 KeV.

10. The method of claim 8, wherein the step of performing an ion implantation process comprises a dosage of $10^{14}$–$10^{17}$ ions/cm$^2$.

11. The method of claim 8, wherein the step of performing an ion implantation process comprises an implanting depth of 80 nm–200 nm.

12. A method for forming a capacitor with ion implantation, the method comprising:
   forming a conductive layer on an substrate;
   performing an ion implantation process to implant ions into the conductive layer, wherein the ions can react with the conductive layer;
   performing an annealing process to trigger a reaction between the implanted ions and ions of the conductive layer to form a dielectric layer within the conductive layer; and
   patterning the dielectric layer and the conductive layer, wherein an upper portion of the conductive layer above the dielectric layer serves as an upper electrode, and a lower portion of the conductive layer below the dielectric layer serves as a lower electrode.

13. The method of claim 12, wherein the conductive layer comprises polysilicon.

14. The method of claim 13, wherein the step of performing the ion implantation process comprises implanting oxygen ions.

15. The method of claim 14, wherein the step of performing an ion implantation process comprises an ion energy of 30 KeV–80 KeV.

16. The method of claim 14, wherein the step of performing an ion implantation process comprises a dosage of $10^{14}$–$10^{17}$ ions/cm$^2$.

17. The method of claim 14, wherein the step of performing an ion implantation process comprises an implanting depth of 80 nm–200 nm.

* * * * *